United States Patent
Wang et al.

(10) Patent No.: US 7,840,919 B1
(45) Date of Patent: Nov. 23, 2010

(54) RESOURCE MAPPING OF FUNCTIONAL AREAS ON AN INTEGRATED CIRCUIT

(75) Inventors: Qiang Wang, Campbell, CA (US);
Aaron Ng, Belmont, CA (US); Rajat Aggarwal, Sunnyale, CA (US)

(73) Assignee: Xilinx, Inc., San Jose, CA (US)

( * ) Notice: Subject to any disclaimer, the term of this patent is extended or adjusted under 35 U.S.C. 154(b) by 490 days.

(21) Appl. No.: 12/024,343

(22) Filed: Feb. 1, 2008

(51) Int. Cl.
*G06F 17/50* (2006.01)

(52) U.S. Cl. .............................. 716/2; 716/13; 716/14; 716/16

(58) Field of Classification Search ..................... 716/2, 716/13, 14, 16
See application file for complete search history.

(56) References Cited

U.S. PATENT DOCUMENTS

| | | | | |
|---|---|---|---|---|
| 5,798,936 A | * | 8/1998 | Cheng | 716/13 |
| 6,370,673 B1 | * | 4/2002 | Hill | 716/2 |
| 6,983,439 B1 | | 1/2006 | Saunders et al. | |
| 7,197,734 B1 | * | 3/2007 | Singh et al. | 716/8 |
| 7,290,239 B1 | * | 10/2007 | Singh et al. | 716/18 |
| 7,574,685 B1 | * | 8/2009 | Dong et al. | 716/11 |
| 7,669,160 B2 | * | 2/2010 | Furnish et al. | 716/9 |
| 7,752,588 B2 | * | 7/2010 | Bose | 716/10 |
| 2007/0204252 A1 | * | 8/2007 | Furnish et al. | 716/10 |
| 2008/0216025 A1 | * | 9/2008 | Furnish et al. | 716/2 |
| 2008/0216039 A1 | * | 9/2008 | Furnish et al. | 716/9 |
| 2008/0216040 A1 | * | 9/2008 | Furnish et al. | 716/10 |
| 2009/0254874 A1 | * | 10/2009 | Bose | 716/6 |

\* cited by examiner

*Primary Examiner*—Phallaka Kik
(74) *Attorney, Agent, or Firm*—Scott Hewett; Lois D. Cartier

(57) ABSTRACT

The availability of device resources of an IC are quantified for a circuit design by building a representation of resource sites for the IC. Initial availability values are assigned to the resource sites, and any components having locking constraints are identified and placed into their respective sites. From the remaining resource sites, candidate sites for a component of the circuit design are identified. The candidate sites are summed, and the initial availability values of the candidate sites are modified according to the sum.

20 Claims, 7 Drawing Sheets

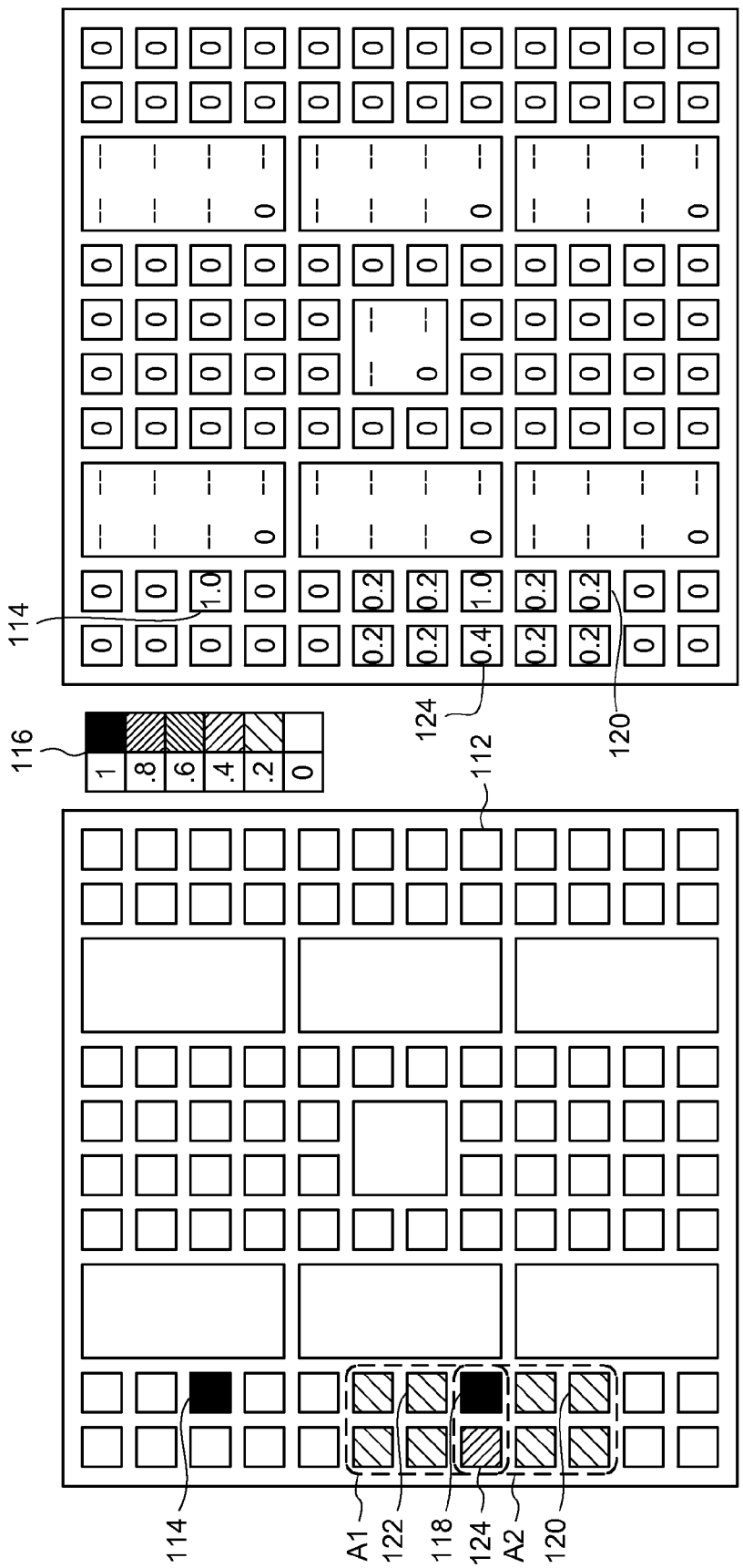

RESOURCE MAPPING OF FUNCTIONAL AREAS ON AN INTEGRATED CIRCUIT

FIELD OF THE INVENTION

The present invention relates generally to integrated circuits ("ICs"), and more particularly to identifying which areas of a programmable logic device are available as resources for an application implemented on the programmable logic device.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), slices, look-up tables ("LUTs"), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Assigning a hardware unit of an FPGA and configuring it to perform the desired function for a specific circuit component (i.e., a component of the circuit that the FPGA is configured to operate as) is referred to as "placing" the component. The process of assigning and configuring hardware units on an FPGA to all the components in a circuit is called "placement". The term "site" is used to describe the physical location on an FPGA where a circuit component is implemented on the FPGA.

ICs are designed using computers programmed with electronic design automation ("EDA") and electronic computer-aided design ("EGAD") tools. These tools are used to provide both logical and physical synthesis. EDA tools take an abstract representation of a circuit design and transform it into an arrangement of logic or other structures connected to one another as described in a network list ("netlist"). The netlist is provided to a synthesis tool that directs a placer of a place-and-route tool. The synthesis tool drives the placer according to standard conventions and design-, device-, or user-specific constraints. In other words, the placer is a software tool that performs the task of placing circuit components to specific physical sites of an FPGA in order to implement a circuit design (application) on the FPGA.

In one example, a placer implements a circuit on an FPGA in two phases. First, the placer distributes all the components into areas of an FPGA design (i.e., a software representation of a physical FPGA chip), which is called "spreading". Second, the placer assigns specific sites of the FPGA to each circuit component in an operation called "fitting".

The way a placer decides on spreading a component into a chip area or fitting it on a site is derived by considering many aspects of the circuit and the chip, such as whether the site can be configured to perform the function of the component, the distances between the component and other components that it will be connected to, and whether the site is already used by another component.

A component might not require all the resources of a site and placing the component at that site would not fully utilize the resources of the FPGA chip. The way in which a conventional placer assigns a component to a site becomes difficult when the number of components is close to the number of available sites.

A placement tool uses algorithms that find legal locations for all the components of a design on the IC chip. Unfortunately, conventional placement tools typically produce solutions that do not guarantee that components do not share device resources. Resource sharing is commonly known as overlap or over-subscription. Over-subscription degrades the quality of the overall placement and final placement solutions because downstream algorithms in the placement flow work off of the overall placement solution.

It is desirable to place components of a circuit implemented in an FPGA in a manner that avoids the problems of the prior art.

SUMMARY OF THE INVENTION

The availability of device resources of an IC are quantified for a circuit design by building a representation of resource sites for the IC. Initial availability values are assigned to the resource sites, and any components having locking constraints are identified and placed into their respective sites. From the remaining resource sites, candidate sites for a component of the circuit design are identified. The candidate sites are summed, and the initial availability values of the candidate sites are modified according to the sum.

BRIEF DESCRIPTION OF THE DRAWINGS

FIG. 1C is a plan view of the site subscription array FPGA of FIG. 1A with location constraints for placement, in accordance with an embodiment of the present invention.

FIG. 1D is the array of FIG. 1B indicating the values associated with the location constraints of FIG. 1C, in accordance with an embodiment of the present invention.

DETAILED DESCRIPTION

Figure 1A:
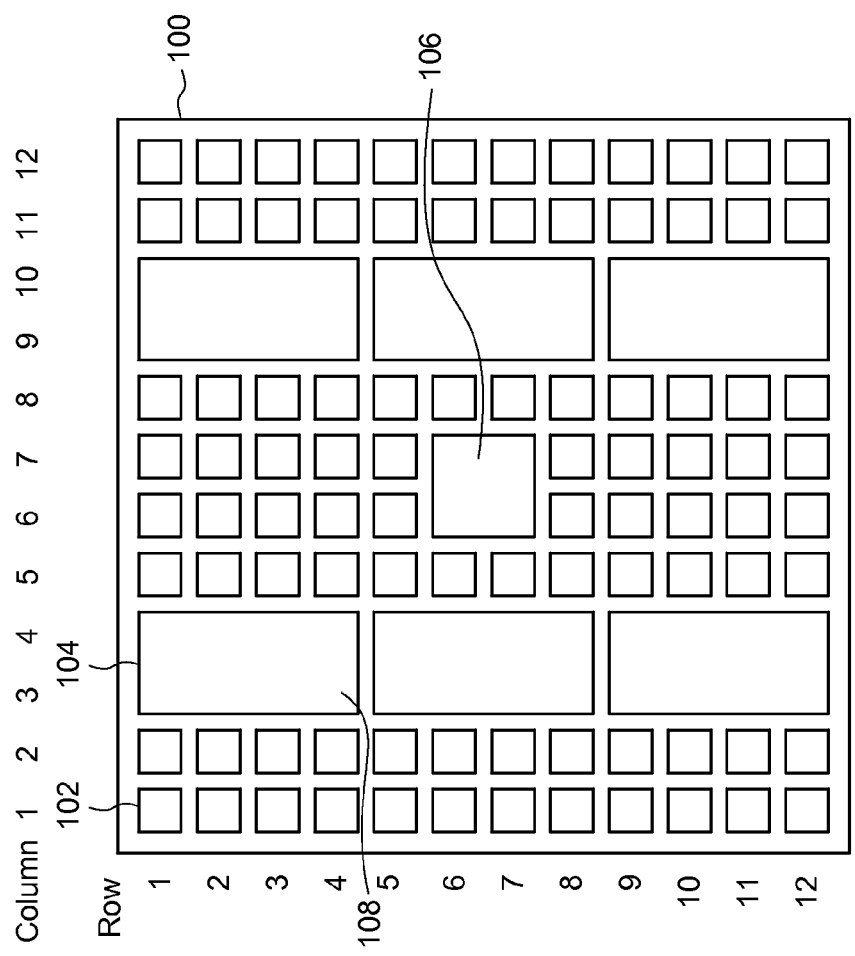
FIG. 1A is a plan view representing an FPGA chip having different types of sites.

When using a placer to place a circuit onto the programmable fabric of a programmable logic device, such as a field programmable gate array (FPGA), the choice of placing a component on a specific site requires not only that the hardware functionality is available, but the specific implementation rules are obeyed. Some of these rules are related to the limited configurability of interconnections or dedicated wire connections between different sites on the FPGA.

For example, to implement an adder using carry-chain units, all the components, each of which represents a bit of carry logic, must be placed on carry sites in a consecutive pattern. In another example, implementation rules restrict a group of components in a circuit to a set of sites on an FPGA that have a fixed pattern of relative locations. To place components belonging to a group, the placer must find a collection of sites such that all the components in the group can be placed within the fixed relative locations. There are usually many types of components in a group, each of which have unique site requirements. In other cases, a user might want some circuit components to be placed within specific areas on an FPGA, which is commonly called an area constraint.

These types of implementation rules impose structural restrictions on how sites are assigned to components. When the total number of sites required by a circuit is close to the total number of available sites, the placer makes placement decisions based on how many different components need to use a site, and, at the same time, how many different sites can be used by a particular component. Techniques for placing components onto an IC chip design, including scoring placement solutions, are described in commonly owned U.S. Pat. No. 6,983,439 B1 entitled UNIFIED PLACER INFRASTRUCTURE, issued Jan. 3, 2006 to Saunders et al., the disclosure of which is hereby incorporated in its entirety for all purposes.

One result of complex site placement requirements for circuit components is that it is difficult to quantify the availability of device resources. A model for quantifying resource availability is developed that represents the resource requirements of circuit components and the subscription of device resources.

One way to represent resources (functional units) on an FPGA is to use a two-dimensional array of elements ("element grid") where each element represents a fine-grained functional unit. Alternatively, a database, spreadsheet, table or other representation of the two-dimensional IC chip design can be bused instead of an element grid representation. Each array element can be associated to a site on an FPGA with information about functionality, physical location on the FPGA, and the usage status for that site or element. An embodiment of the invention uses a heuristic method to estimate site availability while considering multiple candidate components for utilizing the same sites. The technique prioritizes candidate components on a particular site, and updates changes of availabilities when a placement is made.

In one embodiment, a software tool based on a two-dimensional data array is implemented. Elements of the array contain a datum or data representing the availability of a physical site on the FPGA for placing circuit elements. For purposes of convenient discussion, this software tool will be referred to as a "resource map".

The resource map is an availability model that includes a two-dimensional array or other representation of the physical layout (map) of an FPGA chip design or other PLD chip design and a software tool that includes functions to create, update, and process availability information of the sites on the FPGA device. An exemplary technique according to an embodiment produces a site subscription map ("SSM") and a component density map ("CDM") to build a resource map. The SSM indicates how subscribed a site is, i.e., how many components are competing for a particular site, or the number of components expected to be placed in a site.

The resource map is typically initialized at the beginning stage of the placing process to indicate that all sites on an IC chip design are initially available; however, some sites on the IC chip design might be reserved or restricted, or might be subject to user-selected location constraints. In some embodiments, an FPGA is constructed with a variety of functional units in a regular pattern (see, e.g., FIG. 6). The site locations of functional units are based on a two-dimensional grid or other representation, and each site is associated with a row index and a column index, for example. The row and column indices of a site are used to associate the corresponding array elements of the resource map. In some embodiments, some functional units occupy a larger physical size than others, and occupy multiple cells on the IC chip design grid.

Each functional unit is represented by one site and is associated with one array element in the data array of the resource map. In some embodiments, some elements in the data array are not associated with any site on the FPGA chip. For example, some elements might not need to have a site assigned to them, or some elements may not be assigned a site at a particular point in the placement flow. Algorithms may choose to assign or unassign sites to elements throughout the flow. When initializing the data array, only elements that are associated with sites on the FPGA are considered valid and assigned with an initial value indicating that the site is completely available. For example, zero is initially assigned to indicate that a site is completely available (unsubscribed), and the value increases as site availability decreases to a value of one, for example, which indicates that a site is unavailable for component placement. In an alternative embodiment, an initial value of one is assigned to indicate complete availability, and the value is reduced as that resources of the element are placed.

Array elements that are not associated with existing sites are considered to be invalid, and are assigned a value indicating their invalid state. Generally, the invalid value is a value that will not arise for an available or partially available site. In some embodiments, the invalid value is a value that is not obtained or capable of being obtained by a valid site, and in alternative embodiments, the invalid value is the same as a completely used site.

In one embodiment, floating-point values from zero to one are assigned to the valid array elements. A value of zero indicates that a site is completely available, and a value of one indicates that a site is completely used (i.e., components have already been placed at that site). A value greater than one on an element indicates that too many components have been subscribed to that site, which is called oversubscription. In the case of oversubscription, at least one component is typically assigned to an alternative site as a candidate for placement. In some embodiments, the fitter runs in an iterative fashion until all components are assigned to sites, and no site has a value greater than the value associated with a completely used or otherwise unavailable site (e.g., the value is not greater than one).

FIG. 1A is a plan view representing an FPGA chip 100 having different types of sites. Sites are physical locations on an IC where components of a circuit design are placed. For example, sites on the FPGA include slices 102, BRAMs 104, and a microprocessor 106. The FPGA typically includes other types of sites, such as transceivers, look-up tables, and clock buffers. The sites are shown as being rectangular; however, sites are not limited to a rectangular form in alternative embodiments. Note that the BRAM 104 spans multiple rows and columns. In particular embodiments, a large site is identified in an availability array by a single availability value. In one embodiment, a row and a column within the site, such as a corner 108 (row 4, column 3 of FPGA 100) of site 104 is assigned the value. Smaller sites that lie within a row and column (e.g., site 102, which lies on row 1, column 1) are similarly assigned an availability value.

Figure 1B:
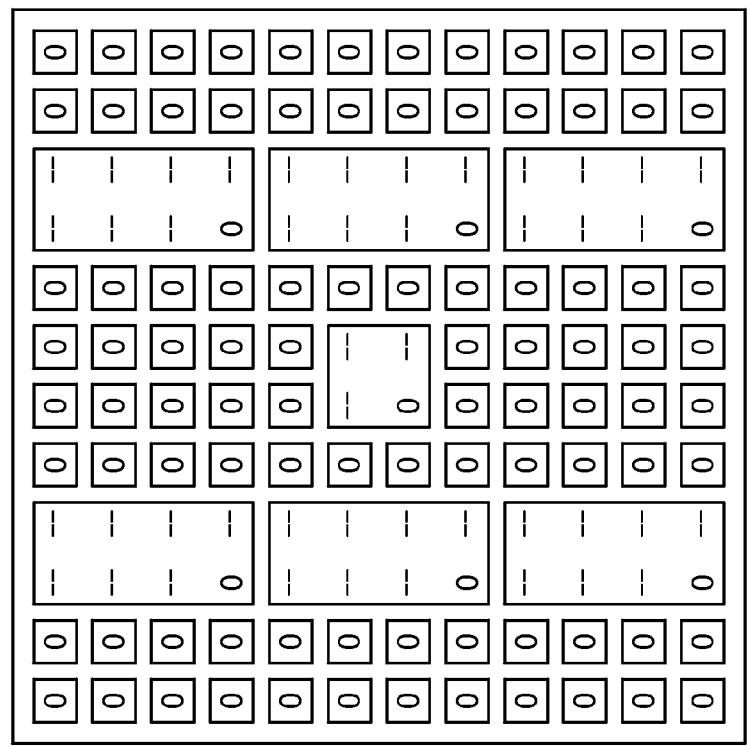
FIG. 1B is an array of the FPGA of FIG. 1A indicating initial site availabilities.

FIG. 1B is an array of the FPGA of FIG. 1A indicating initial site availabilities. All site availabilities are initialized to zero. Alternatively, different initial values are established, such as assigning an initial value of one. In alternative embodiments, not all sites have the same initial value. For larger sites, such as site 104, a single value is acceptable, even though the site encompasses more than a single row or column. Alternatively, all intersections of rows and columns within a large site are assigned the same value.

FIG. 1C is a plan view of the site subscription array FPGA of FIG. 1A with location constraints for placement. The location constraints are user constraints, object location constraints, or timing constraints, for example. The location constraints are indicated by increased shading. A clear site (e.g., site 112) is associated with an unused site having an initial value of zero. A blackened site (e.g., site 114) is associated with a completely used or otherwise unavailable (e.g., locked) site. The legend 116 shows the shading used to represent availability values for the sites.

Location constraints are input into the resource map tool according to the intended configuration (i.e., application) of the FPGA. There two forms of location constraints. One type of location constraint is a locking constraint, which assigns a specific site to a circuit component. Sites 114 and 118 are locked sites having locking constraints, and are unavailable for placing circuit components other than the circuit components that are required to be placed in these sites. For locking a component to a site, the corresponding array element is assigned an availability value of 1 to indicate that that site is locked (i.e., reserved), and cannot be used to place any other component.

The other type of constraint is an area constraint. An area constraint restricts the placement of a component within an area of the FPGA, such as areas A1, A2, which are defined by dashed lines. Sites 120, 122 are examples of area-constrained sites within either area A1 or area A2. Some sites, such as site 124, are doubly area constrained because they fall within multiple area constraints, namely, site 124 falls within both A1 and A2. The other site 118 that falls within A1 and A2 is a locked site, and thus has an availability value equal to one.

The resource map tool, which in one embodiment are software instructions implemented on a design tool, checks all the sites within a constrained area (e.g., area A1) and counts the total number of sites that can be used to place the area-constrained component, which in this example is five sites. Locked sites (e.g., site 118) are not included in this count. A value of 1/N, where N is the count of sites within the constrained area, is added to the initial value. In this example, five sites are available within the constrained area A1, which produces a value of 1/5=0.2. This value (0.2) is added to the initial site values of zero to produce an availability value of 0.2 for each of the available sites within A1. The process is repeated in a similar fashion for A2 and other constrained areas on the FPGA, and values are added for sites falling within multiple areas constraints (i.e., within overlapping area constraints), such as site 124, which is within A1 and A2. In some embodiments, two constrained areas overlap in a congruent fashion. In other embodiments, one constrained area is completely within a second constrained area. For components that are not constrained to an area, the number of available sites suitable for that component are counted, and the inverse of that count is added to the availability values for the sites.

After processing the input constraint information, the array elements accumulate potential resource requirements on the sites of the FPGA for placing the circuit components of the intended circuit. A fitting technique is then used to find legal assignments for all circuit components on the device while minimizing degradations in the quality of the overall placement solution. One way to consider the circuit design going into the fitter is as a cloud of components and connections. These components are progressively placed in tentative locations, which the fitter makes more definite as specific locations on the device are identified to place components without unduly disrupting the upstream placements. The overall placement solution is typically a netlist or similar representation of the placed circuit.

The greater the value on an array element, the higher the competition among circuit components for that site, and the lower the availability. A lower value for an array element indicates a higher availability on the associated site. FIG. 1D is an availability array of the FPGA of FIG. 1C with the availability values shown in the associated rows and columns. For example, site 120 has a value of 0.2, indicating that it is one of five candidate sites within area A2. Similarly, site 124 has a value of 0.4, which indicates that it is one of five candidate sites in area A1, increasing the availability value to 0.2, and is also one of five candidate sites in area A1, further increasing the availability value by 0.2 for a total value of 0.4. Site 114 is given an availability value indicating that it is a locked site, and unavailable for placement of other components. Alternatively, a high availability value indicates low competition for a site. For example, totally available sites are assigned an availability value of "1", and the availability value decreases with increasing competition for the site. An availability value of "0" in this alternative would indicate an unavailable (i.e., already placed or locked) site.

To avoid failing to fit a component in an overlapped constraint area, when an array element already carries an availability value of one, the resource manager heuristically prohibits some candidate components to use the site corresponding to that element. When a component is allowed to use a site, its portion of the reserved resource is added to the corresponding availability value for that array element and the site is recorded as a candidate site for the component.

A resource map tool can be used to prioritize component placement within constrained areas by computing the total resource availabilities for the components. In one embodiment, the total resource availability is $\Sigma(V_i)/n$ wherein $V_i$ is the availability value of an array element corresponding to a candidate site within an area and n equals the number of available (candidate) sites within the area. A higher summed value indicates a higher priority for the corresponding component to use to select a candidate site within the constrained area as a target placement site. For example, referring to FIG. 1C, there are five available candidate sites in area A1 and one unavailable site 118. Four of the available candidate sites have an availability value of 0.2, and one of the available candidate sites has an availability value of 0.4. The sum of the availability values within area A1 is 1.2, and 1.2 divided by five (the number of available candidate sites) provides a score of 0.24. The score represents the quality of placement of a component on a site within the identified area.

Fitting is difficult because of the fixed physical layout of an FPGA chip and competing performance optimizations, and difficulty of fitting increases with increasing design complexity and chip resource utilization. Critical components are constrained to a subset of the total possible number of sites due to a number of different requirements. For example, some components must obey certain architecture-dependent clocking rules and are constrained to certain clock regions. Similarly, components that share interconnect resources, such as flip-flops that share control signals, must be compatible, and multi-component groups sometimes require specific placement locations due to physical synthesis constraints, such as carry chains, due to user constraints, such as incremental design, or multiple components must be fitted and placed into a particular area of the FPGA chip.

It is also desirable to efficiently utilize hardware resources when fitting and placing components. Efficient utilization is particular important when most of the device resources are allocated to circuit components. For example, in a VIRTEX 5 FPGA, which is available from XILINX, INC. of San Jose, Calif., there are four flip-flops per slice. All four flip-flop sites can only be used if they share the same control signals. Without proper fitting, where only one of the four flip-flops is used to implement a circuit component, the other three flip-flops would not be utilized, resulting in inefficient hardware utilization (i.e., 75% of the slice is wasted). In comparison, a VIRTEX 4 FPGA, also available from XILINX, INC., of San Jose, Calif., has two flip-flops per slice. If only one flip-flop in the slice is used to implement the circuit component, only half the slice is wasted. Thus, efficient fitting is particularly important in FPGAs having four or more flip-flops per slice. Wastage of chip resources could lead to degradation in circuit performance, and, can cause a design to be unplaceable when device utilization is high.

In one embodiment of an overall placement tool, components of a circuit design are placed on an FPGA and then unplaced. That is, the components have a desired location on the chip, but unique functional units have not been assigned to them. The fitting process finds assignments of device resources for all of the circuit components; thus, fitting is a packing problem.

The order in which circuit components are fit and the selection of the sites for each component significantly affects quality of result ("QOR") and fittability. Ordering is an artifact of the fitting algorithm that tries to solve a specialization of the packing problem. In these fitting algorithms, the order in which items are optimized affects the eventual solution. For example, single look-up table ("LUT") components typically have minimal placement constraints and can be placed at any available LUT site on the FPGA chip. However, carrychains that span several slices have a larger and more constrained footprint. Placing an LUT before placing a carrychain can result in an obstruction. Since the LUT can usually be placed in any suitable site, it is more efficient to fit/place the carry-chain first, and then fit/place the LUT. In a particular embodiment, a fitter uses a fit-first strategy that fits the largest components first.

However, it is not always easy to evaluate how constrained a component is by only its size. A component may have area-group constraints from the user, and the area group constraints might overlap with other components' area groups. Even a small group with no user constraints might be more constrained than a large group, such as if the smaller group requires a scarce resource (e.g., a digital signal processor ("DSP")). A conventional fitter uses heuristic techniques to place the components of a circuit design to sites on the IC to arrive at an overall placement solution. Embodiments provide a fitter the ability to quantify how constrained one component of a design is compared to another component. In an embodiment of a resource map tool, a fitter prioritizes the fitting order of components according to how constrained the components are.

The resource map provides a fitter tool with data to approximate the subscription of a particular site, and to estimate how many different components are competing for a particular resource. After an initial overall placement solution is obtained, the quality of the overall placement is determined by adding the component scores to provide an overall placement score. It is generally desirable to not unduly modify the overall placement solution determined by the fitter; however, embodiments provide techniques for improving the overall placement score.

After initial placement, components that are candidates for moving to alternative sites are identified, such as by evaluating individual component scores. Candidate sites are identified that these components might be moved to without unduly degrading the overall placement score. The fitter tool adds the scores for components associated with a number of possible candidate sites using a utility such as a timing analyzer, delay estimator, or power analyzer that provides a component score, and adds the scores of the components to obtain an overall placement score for alternative placement solutions.

When a component is moved from one site to another site, the component score determined by the utility typically changes. The scores determined by the utility help to preserve the overall placement solution quality as we move components from one site to another. The overall placement score is adjusted using updated component scores and information from the resource map tool, i.e., the overall placement score is re-calculated from the scores of the components transferred to alternative sites after placement of more critical components. For example, the most critical components are placed first, and then the resource map is recalculated, then the next most critical components are placed, etc. In a particular embodiment, multiple overall placement scores are evaluated by a fitter before a final overall placement solution is defined.

Generally, placing components in a site with a lower availability value is preferred; however, several exceptions can be allowed. For example, a component is placed in an occupied slice as long as the resulting overall placement score is within a pre-selected difference of the initial overall placement score. Similarly, it may be desirable to hold unoccupied sites open as long as possible in the placement progression, and discourage selection of an unoccupied slice unless the overall placement score is improved by more than a pre-selected amount, which is user-defined or empirically determined, for example. A site with high availability might be preferred even if the resulting component score increases, or a more-subscribed site might be preferred if the resulting component score decreases.

A resource map tool can also provide valuable information for debugging placer algorithms. A resource map can be plotted on a representation of a physical IC to visualize the congested areas on a chip. This allows a circuit designer to identify potential trouble areas and evaluate the performance of their heuristics.

Figure 2:
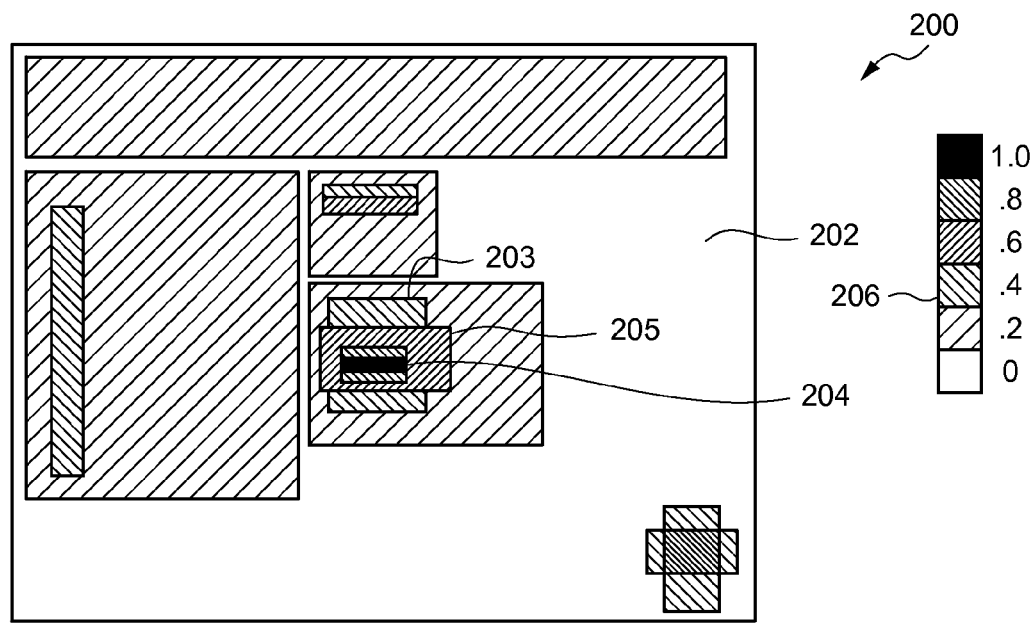
FIG. 2 is a plan view of a footprint of an FPGA 200 representing a site subscription map, in accordance with an embodiment of the present invention.

FIG. 2 is a plan view of a footprint of an FPGA 200 representing a site subscription map in an embodiment, in accordance with an embodiment of the present invention. In this representation, the closer the hatching, the higher the subscription value for that region of the FPGA 200. For example, the clear field 202 represents the least subscribed region, and the darkest field 204 represents the most subscribed region. The key 206 correlates hatching with subscription value. A circuit designer considering FIG. 2 would see that the areas 203, 204, 205 near the center of the FPGA 200 are congested, with area 204 being fully subscribed or oversubscribed. Such congestion can make it difficult (e.g., time consuming and low overall placement quality) to fit the circuit to the IC. If the congestion arises due to user constraints, the user would be able to quickly evaluate which constraints are causing the congestion, and possibly modify the constraints to relieve congestion to result in a high-quality circuit placement.

A resource map tool is also useful for user reporting. For example, if the most constrained components are fit first, yet are still unable to be placed, it is a good indication that the components are overconstrained. In a particular embodiment, a resource map tool is configured to remember all the components subscribed to their respective sites. When a problematic (congested) component is identified, the placer software uses the resource map to identify all of the other components competing for the same site. The software then provides a warning to the user that the site is becoming congested.

In some embodiments, a resource map tool is used to place components according to clock signals. On an IC chip, there are limitations on the total number of clock buffers and clock wires. Each clock buffer can only be connected within a scope of the IC. To decide which input pin and clock buffer should be used for a particular clock signal, a placer needs to decide whether or not there are adequate sites available within the scope that can be reached from the candidate clock buffer to meet the resource requirements of components connected to the clock signal. Since users often would need to specify placement constraints within areas across multiple clock regions, the actual availabilities of sites in a region cannot be determined until the constrained components are finally placed. However, the placement of the constrained components often needs to be done after clock placement is done.

As a result, when assigning a clock buffer to a particular clock signal during placement, it is difficult to decide whether or not the corresponding clock region can actually provide all the sites that are required by the load components of the clock signal. A placer using a resource map tool can more precisely estimate the availabilities of resources, as well as the priorities to use them, for the clock being placed in each of the potential regions.

Figure 3:
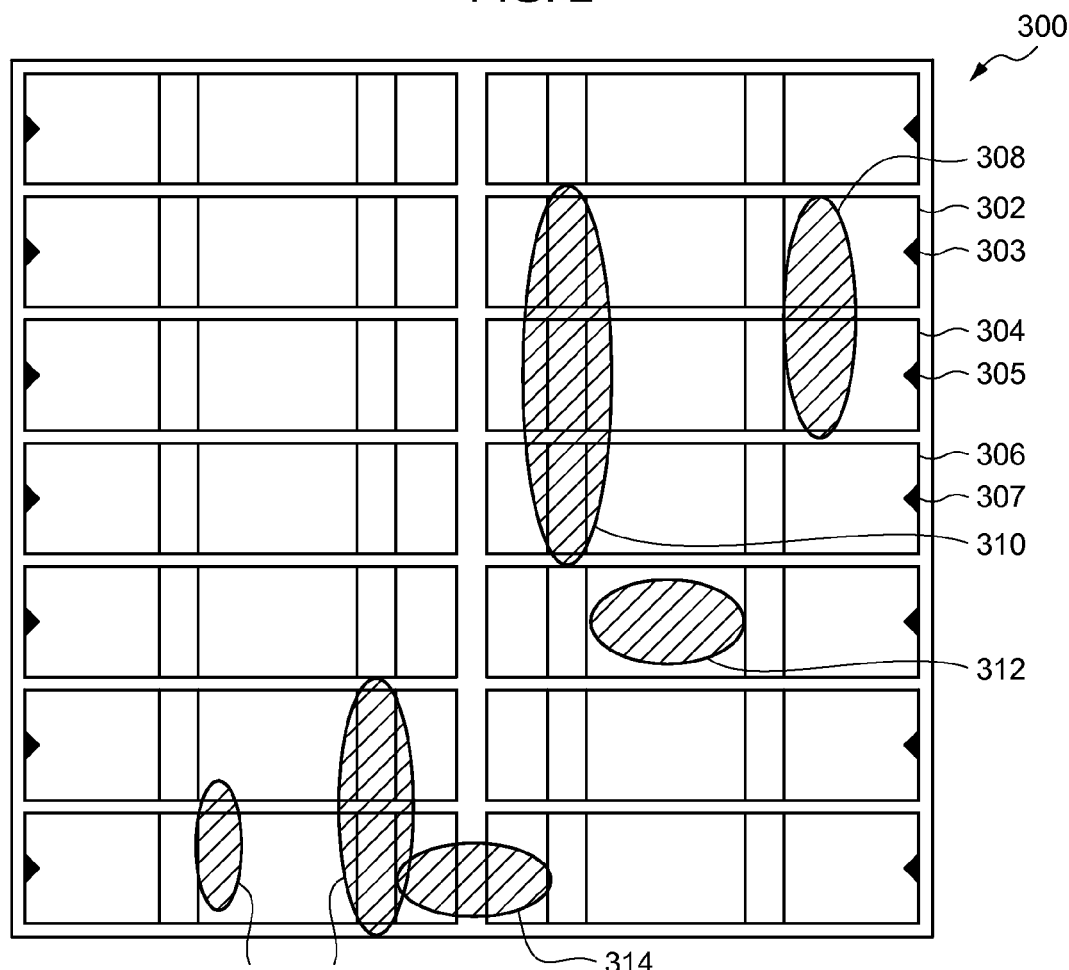
FIG. 3 is a plan view of an FPGA illustrating placement constraints associated with multiple clock regions, in accordance with an embodiment of the present invention.

FIG. 3 is a plan view of an FPGA 300 illustrating placement constraints associated with multiple clock regions. The FPGA 300 has fourteen clock regions, e.g. clock regions 302, 304, 306, and each clock region has a dedicated clock buffer 303, 305, 307. The hatched areas 308, 310, 312, 314, 316, 318 reserve some availability of covered sites by adding values on the SSM array elements. The availability calculation for placing components related to clocks will be based on the SSM after being added to the values associated with the hatched areas. Since some of these constrained regions fall within multiple clock regions, it is difficult to decide how many resources in a particular clock region are required to meet the clock load. By building an availability array (SSM), a placer can effectively estimate the actual available resources for clock placement. By collecting array elements associated with particular types, a placer can calculate whether or not a clocking resource is adequate to meet the load required by an element of an IC design.

Figure 4A:
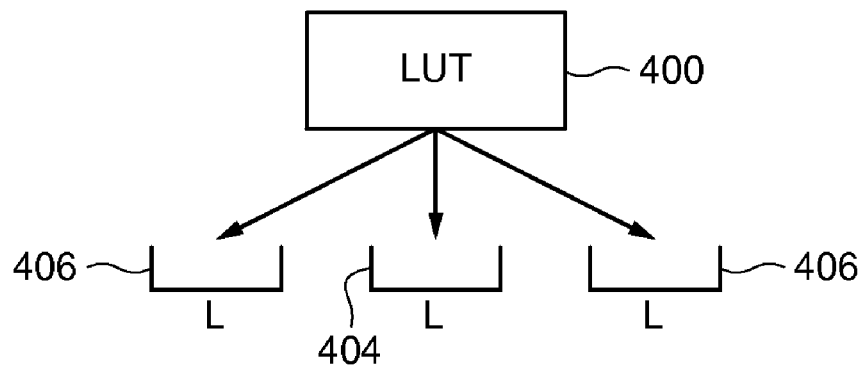
FIGS. 4A and 4B illustrate placement of circuit components in overlapping device sites, in accordance with an embodiment of the present invention.
Figure 4B:
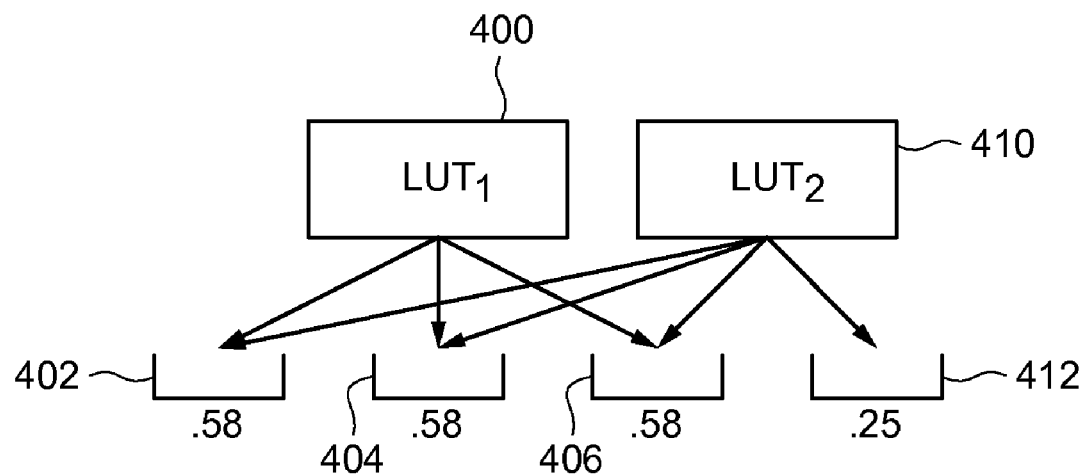

FIGS. 4A and 4B illustrate another example of determining subscription values. FIG. 4A illustrates a LUT 400 and potential LUT sites 402, 404, 406. The LUT 400 can go into any one of the potential LUT sites 402, 404, 406. In this example, the site subscription of each site is ⅓, because the LUT can only be in one site at a time, and the LUT has an equal ⅓ probability of being in any of those sites.

FIG. 4B shows a second LUT 410 and a fourth LUT site 412. LUT 400 is constrained to be placed in LUT sites 402, 404, 406, while LUT 410 can be placed in LUT sites 402, 404, 406, or 412. The subscription value for LUT sites 402, 404, and 406 is ¼+⅓=7/12 (0.58), and the subscription value for LUT site 412 is ¼ (0.25). After the SSM is built, each component now has view of its candidate sites, i.e., the compatible sites, and their associated subscription values.

The CDM indicates which components are the most constrained. A component's "density" is the minimum subscription value of all its candidate sites. For example, the density value for LUT 400 is 0.58, and the density value for LUT 410 is 0.25. The best-case site for placing a component is the site with the lowest subscription value. In this example, it is the LUT site 412 that is expected to have 0.25 components placed in it. A component's density value is representative of how constrained that component is.

In an embodiment, a resource map is used to heuristically fit components to an IC chip design by fitting the most constrained components first (i.e., fitting the component having the highest density value first, etc.), and, whenever possible, fitting components into the least-subscribed sites. In a particular example, two decisions are made. First, the algorithm decides which components to select for fitting. The algorithm selects the most constrained component (the component with the fewest options for places to go). Once a component is selected, the next decision is where to place the component. This is where site subscription comes in. Lesser-subscribed sites are preferred.

Figure 5A:
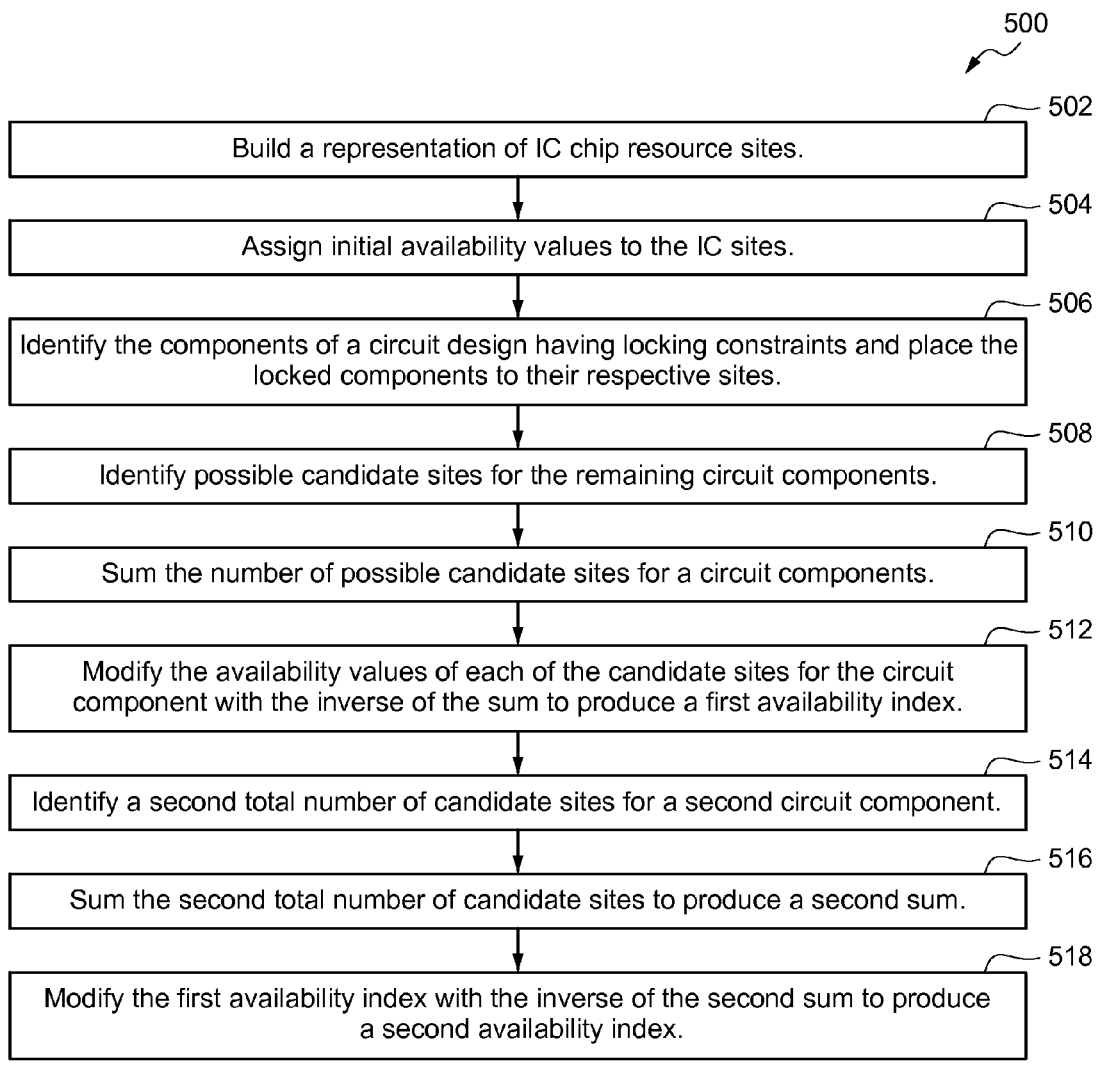
FIG. 5A is a flow chart of a method of quantifying the availability of device resources according to an embodiment.

FIG. 5A is a flow chart of a method 500 of quantifying the availability of device resources according to an embodiment. A device, such as an IC, is represented as a two-dimensional array of functional units (step 502). In a particular embodiment, the IC is an FPGA having functional units representing sites in a regular pattern represented in a grid. The array is initialized (step 504) by assigning initial availability values to the sites. In a particular embodiment, each site is assigned an initial availability value indicating that no circuit component has been placed in the site. Locked circuit components (if any) of an IC circuit design are placed onto the corresponding sites (step 506), making these sites unavailable for placement of other components. The remaining sites are identified for the remaining components of the circuit (step 508). For example, if an IC circuit component is constrained to a particular site, that site is identified for unique placement of the constrained component (i.e., locked). If an IC circuit component may be placed in any of several sites, those sites ("candidate sites") are identified. In some embodiments, an area constraint contains several possible sites suitable for placing a circuit component. The total number of non-locked candidate sites that can be used to place a component are summed ("n"), (step 510) and the inverse of the sum ("1/n") is added to or subtracted from the initial value of those candidate sites to produce a first availability index (step 512). In a particular embodiment, the initial value is zero and the inverse of the sum is added to the initial value. In an alternative embodiment, the initial value is one and the inverse of the sum is subtracted from the initial value.

In a further embodiment, a second total number of non-locked candidate sites are identified for a second circuit component (step 514). At least one of the second candidate sites is also a candidate site for the first component (common candidate site), and had the first availability index. The second candidate sites are summed (step 516), and the inverse of the second sum is added to or subtracted from the first availability index of the common candidate site to produce a second availability index for the common candidate site (step 518) (refer to FIGS. 1A-1D). In a yet further embodiment, the sequence of identifying candidate sites and calculating availability indices is repeated for until all circuit components have been considered.

In a particular embodiment, after availability indices for the sites on the IC chip design have been determined, a component is placed to the site having the most availability (e.g., the lowest availability index when the initial value was zero or the highest availability index when the initial value was one) of the candidate sites for that component.

Figure 5B:
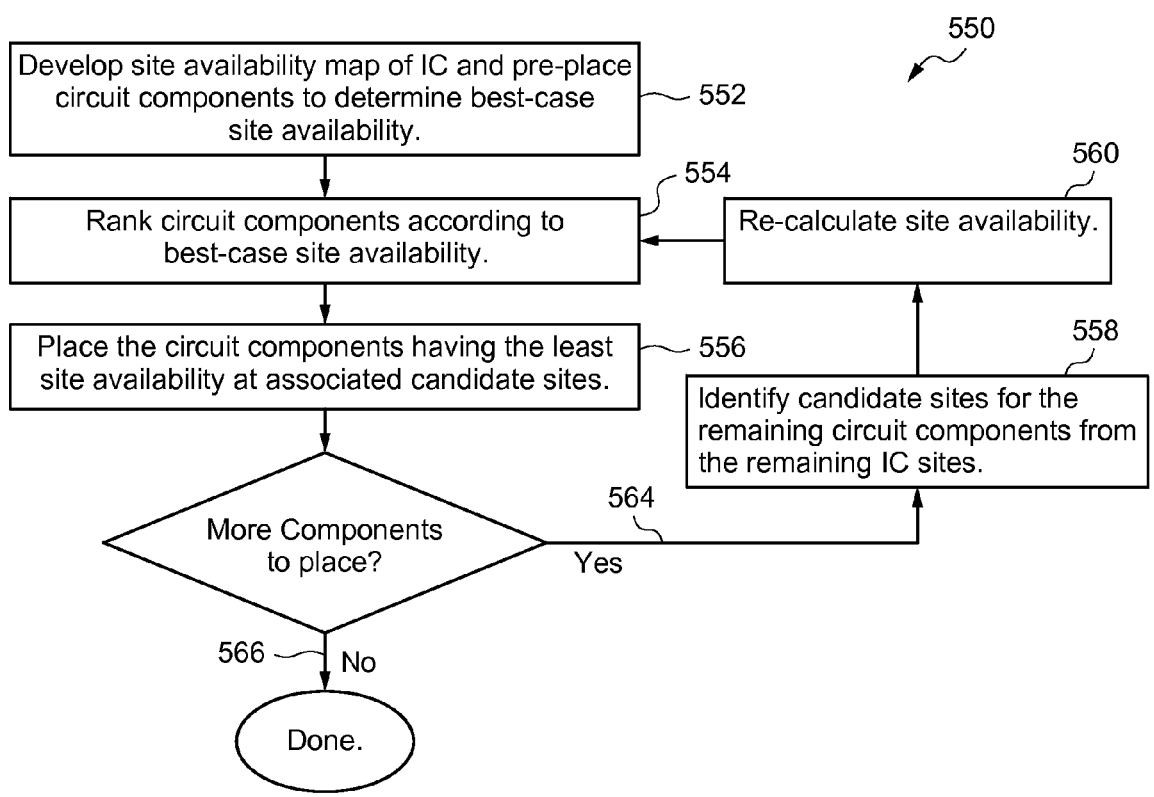
FIG. 5B is a flow chart of a method of placing components in an IC according to another embodiment of the present invention.

FIG. 5B is a flow chart of a method 550 of placing components in an IC according to another embodiment of the invention. An availability index map of functional units (sites) the IC is developed for an IC circuit design (i.e., components) as described above in reference to FIG. 5A. The components are ranked according to their best-case availability (step 552), and components having the least availability are placed first (step 554). In a particular embodiment, a component is placed to a candidate site having the least subscription of the candidate sites for that component. After placing, these sites are locked and not considered as candidate sites in subsequent availability determinations. Candidate sites are identified for the remaining (unplaced) components (step 556), and revised availability indices for the device sites are calculated (558). The components are again ranked (loop 560), and the components having the least revised availability are placed. This process repeats (branch 562) until the IC circuit design has been placed and fitted to the IC chip design (branch 564).

Figure 6:
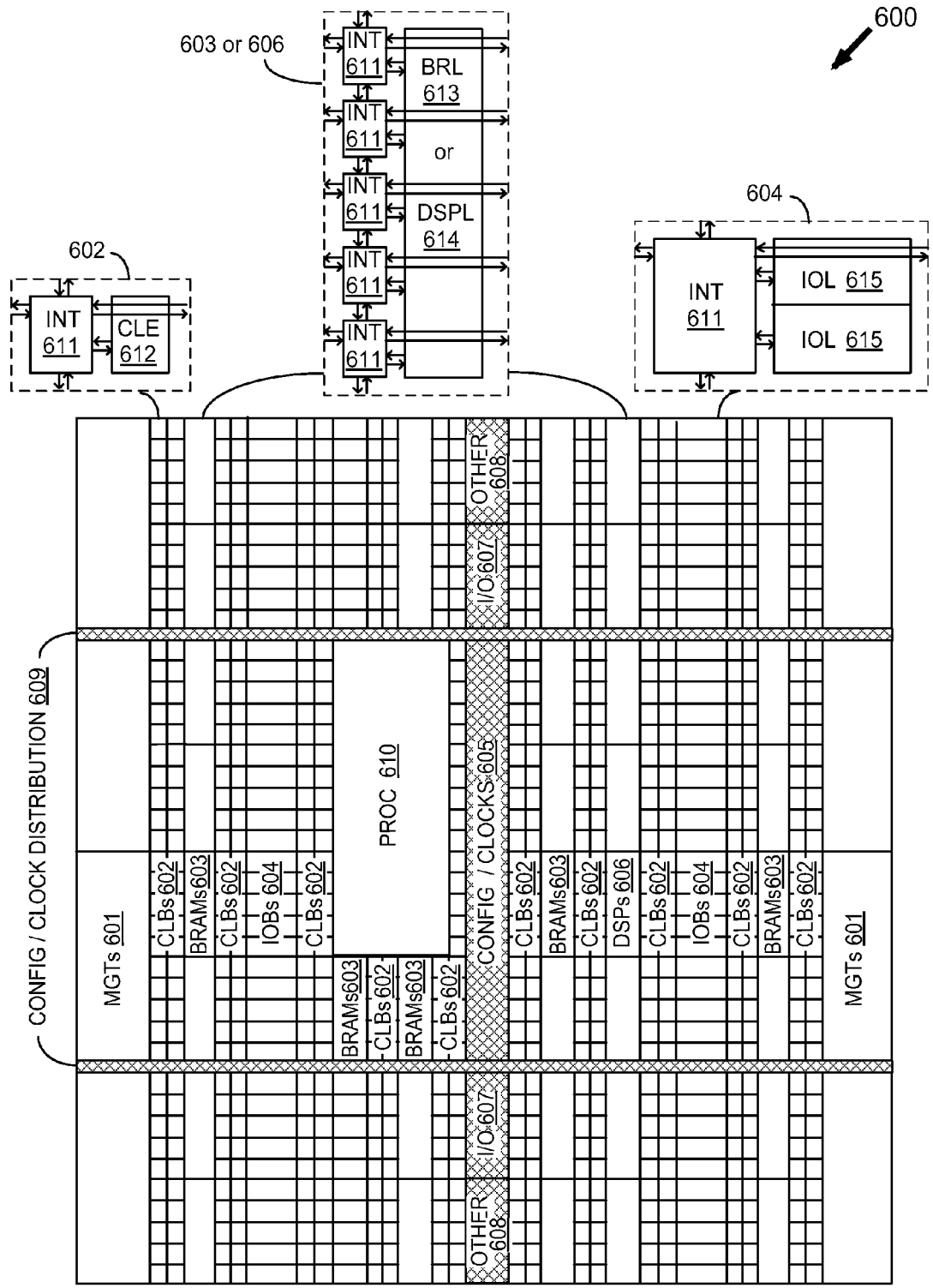
FIG. 6 is a plan view of an FPGA with a circuit design placed according to an embodiment.

FIG. 6 is a plan view of an FPGA 600 with a circuit design placed according to an embodiment. The FPGA includes CMOS portions in several of the functional blocks, such as in RAM and logic, and is fabricated using a CMOS fabrication process. The FPGA 600 is configured (i.e., loaded with an application) according to an embodiment to place and fit components on sites of the FPGA using a site subscription or component density technique.

The FPGA architecture includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6.

For example, a CLB 602 can include a configurable logic element (CLE 612) that can be programmed to implement user logic plus a single programmable interconnect element (INT 611). A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An IOB 604 can include, for example, two instances of an input/output logic element (IOL 615) in addition to one instance of the programmable interconnect element (INT 611). As will be clear to those of skill in the art, the actual I/O pads connected, for example, to the I/O logic element 615 are manufactured using metal layered above the various illustrated logic blocks, and typically are not confined to the area of the input/output logic element 615. In the pictured embodiment, a columnar area near the center of the die is used for configuration, clock, and other control logic.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

One or more embodiments of the invention are implemented as one or more program products for use with a computer system. The program(s) of the program product defines functions of an embodiment of a method of placing components according to a site subscription map or component density map. The program(s) are stored as computer-readable instructions on a computer-readable medium or media, such as electronic ROM, optical ROM, or magnetic storage media, either as part of the design tool system, or stored remote from the design tool system (e.g., at a server) and downloaded to the design tool. Such computer-readable media for storing computer-executable instructions of methods are well-known in the art of IC design.

While the present invention has been described in connection with specific embodiments, variations of these embodiments will be obvious to those of ordinary skill in the art. For example, although specific embodiments are described in terms of a two-dimensional grid array and configurable ICs, alternative embodiments apply. Therefore, the spirit and scope of the appended claims should not be limited to the foregoing description.

What is claimed is:

1. A method of quantifying availability of device resources of an integrated circuit ("IC") for a circuit design comprising:
building a representation of resource sites for the IC;
assigning initial availability values to the resource sites;
identifying first candidate sites for a first component of the circuit design from the resource sites;
summing the first candidate sites to produce a first sum; and
modifying, by a computer, the initial availability values of the candidate sites according to the first sum.

2. The method of claim 1 further comprising, before identifying first candidate sites:
identifying locked components of the circuit design having locking constraints restricting a placement of the locked components to locked sites, a remainder of sites excluding the locked sites, wherein the first candidate sites are identified from the remainder of sites.

3. The method of claim 1 wherein the initial availability value of a site is modified by adding or subtracting an inverse of the first sum to the initial availability value.

4. The method of claim 3 wherein the initial availability value is zero, and the inverse of the first sum is added to the initial availability value to produce a first availability index.

5. The method of claim 4 further comprising:
identifying second candidate sites for a second component of the circuit design from the remainder of the resource sites, the second candidate sites including a common site from the first candidate sites;
summing the second candidate sites to produce a second sum; and
modifying the first availability index of the common site with an inverse of the second sum to produce a second availability index for the common site.

6. The method of claim 5 wherein the second component shares an interconnect resource with the first component, and identifying the second candidate sites occurs within an area of the IC sharing the interconnect resource.

7. The method of claim 6 wherein the IC is a field-programmable gate array and the interconnect resource is a clocking resource.

8. The method of claim 6 wherein the IC is a field-programmable gate array and the interconnect resource is shared control signal.

9. The method of claim 5 wherein the IC is a field-programmable gate array and the first component and the second component form a carry chain spanning a plurality of slices.

10. The method of claim 9 further comprising:
placing the carry chain on the IC; then
identifying third candidate sites for a third component of the circuit design from a second remainder of the resource sites; and
placing the third component within the second remainder of the resource sites.

11. The method of claim 10 wherein the third component is a look-up table.

12. The method of claim 5 further comprising, wherein the second component is larger than the first component:
placing the second component; and then
placing the first component.

13. The method of claim 1 further comprising:
identifying invalid sites of the first component; and
assigning an invalid value to the invalid sites to exclude the invalid sites from the first sum.

14. The method of claim 1 wherein each of the initial availability values is an initial availability value.

15. The method of claim 1 wherein a site in the remainder of resource sites encompasses a plurality of rows or a plurality of columns of device resources of the IC, the site being assigned an availability value.

16. The method of claim 1 further comprising
identifying an area constraint of the first component wherein identifying the first candidate sites occurs within a constrained area of the IC.

17. An article of manufacture, comprising:
a computer-readable storage device storing computer-executable code for quantifying availability of device resources of an integrated circuit ("IC") for a circuit design, the computer-executable code comprising instructions that when executed by a computer cause the computer to perform operations including:
building a representation of resource sites for the IC;
assigning initial availability values to the resource sites;
identifying first candidate sites for a first component of the circuit design from the resource sites;
summing the first candidate sites to produce a first sum; and
modifying the initial availability values of the candidate sites according to the first sum.

18. The article of manufacture of claim 17 wherein the operations further include, before identifying first candidate sites:
identifying locked components of the circuit design having locking constraints restricting a placement of the locked components to locked sites, a remainder of sites excluding the locked sites, wherein the first candidate sites are identified from the remainder of sites.

19. The article of manufacture of claim 17 wherein the initial availability value of a site is modified by adding or subtracting an inverse of the first sum to the initial availability value.

20. The article of manufacture of claim 17 wherein the operations further include:
identifying invalid sites of the first component; and
assigning an invalid value to the invalid sites to exclude the invalid sites from the first sum.

* * * * *